(12) United States Patent
Horsch

(10) Patent No.: US 10,747,379 B2
(45) Date of Patent: Aug. 18, 2020

(54) INTEGRATION OF SWITCHES IN LININGS

(71) Applicant: Dr. Ing. h.c. F. Porsche Aktiengesellschaft, Stuttgart (DE)

(72) Inventor: Guido Horsch, Althengstett (DE)

(73) Assignee: Dr. Ing. h.c. F. Porsche Aktiengesellschaft (DE)

( * ) Notice: Subject to any disclaimer, the term of this patent is extended or adjusted under 35 U.S.C. 154(b) by 67 days.

(21) Appl. No.: 16/106,088

(22) Filed: Aug. 21, 2018

(65) Prior Publication Data

US 2019/0064963 A1   Feb. 28, 2019

(30) Foreign Application Priority Data

Aug. 23, 2017 (DE) .................. 10 2017 119 226

(51) Int. Cl.

| | | |
|---|---|---|
| *G06F 3/044* | (2006.01) | |
| *H01L 23/58* | (2006.01) | |
| *G06F 3/02* | (2006.01) | |
| *H03K 17/96* | (2006.01) | |
| *B60R 16/00* | (2006.01) | |
| *B62D 1/04* | (2006.01) | |

(52) U.S. Cl.
CPC ............... *G06F 3/044* (2013.01); *G06F 3/02* (2013.01); *H01L 23/58* (2013.01); *H03K 17/96* (2013.01); *H03K 17/962* (2013.01); *B60R 16/00* (2013.01); *B62D 1/046* (2013.01); *H03K 2217/960795* (2013.01)

(58) Field of Classification Search
CPC ............. G06F 3/044; G06F 2203/0339; G06F 2203/04103; G06F 3/03547; G06F 3/02; H03K 17/962; H03K 17/96; H03K 2217/960795; B60R 16/00; B62D 1/046; H01L 51/50; H01L 27/3225; H01L 2251/5338; H01L 23/58; B60K 2370/339; B60K 2370/331; B60K 2370/1446; B60K 2370/654; B60K 2370/143; B60K 35/00
See application file for complete search history.

(56) References Cited

U.S. PATENT DOCUMENTS

| 4,740,781 A * | 4/1988 | Brown .................. G06F 3/0412 |
| | | 341/33 |
| 10,185,425 B2 * | 1/2019 | Omata .................... G06F 3/045 |
| 2009/0273483 A1 * | 11/2009 | Tompkins ............... G01L 1/142 |
| | | 340/657 |

(Continued)

FOREIGN PATENT DOCUMENTS

| AT | 055 019 | 2/2002 |
| DE | 10 2004 009 189 | 9/2005 |

(Continued)

OTHER PUBLICATIONS

Korean Examination Report dated May 31, 2019.

*Primary Examiner* — Muhammad N Edun
(74) *Attorney, Agent, or Firm* — Gerald E. Hespos; Michael J. Porco; Matthew T. Hespos

(57) ABSTRACT

An operating element for a vehicle interior is integrated in a flexible material and comprises an electroluminescent layer arranged between a first conducting layer and a second conducting layer. The arrangement of the first conducting layer, the second conducting layer and the electroluminescent layer is configured to be operable as a capacitive sensor.

17 Claims, 1 Drawing Sheet

(56) References Cited

U.S. PATENT DOCUMENTS

| | | | |
|---|---|---|---|
| 2010/0079379 A1* | 4/2010 | Demuynck | G06F 3/016 345/169 |
| 2011/0148812 A1 | 6/2011 | Hente | |
| 2011/0241850 A1 | 10/2011 | Bosch et al. | |

FOREIGN PATENT DOCUMENTS

| | | |
|---|---|---|
| DE | 10 2006 050 532 | 5/2008 |
| DE | 10 2014 019 439 | 6/2016 |
| JP | 2007-133698 | 5/2007 |
| JP | 2011-213343 | 10/2011 |
| KR | 10-1569930 | 11/2015 |

\* cited by examiner

INTEGRATION OF SWITCHES IN LININGS

CROSS REFERENCE TO RELATED APPLICATION

This application claims priority under 35 USC 119 to German Patent Appl. No. 10 2017 119 226.3 filed on Aug. 23, 2017, the entire disclosure of which is incorporated herein by reference.

BACKGROUND

Field of the Invention

The invention relates to an operating element for a vehicle interior where the operating element is integrated in a flexible material.

Description of the Related Art

DE 10 2004 009 189 A1 describes the use of a deformable carrier of an electric circuit having a textile surface. AT 5019 U1 relates to an interior lining, in which electric or electronic components are embedded in a layer of foam. DE 10 2006 050 532 A1 discloses a lining part of a vehicle interior having a fabric keyboard. DE 10 2014 019 439 A1 describes a lining part with a sensor film that is covered by a decorative surface and capacitively senses the operating actions of the user.

It is an object of the present invention to provide an alternative operating element that can be produced from an easily available starting material and permits actuation by pressure or contact.

SUMMARY

The invention relates to an operating element for arranging in a vehicle interior. More particularly, the operating element is integrated in a flexible material and comprises an electroluminescent layer that is arranged between a first conducting layer and a second conducting layer. The arrangement of the first conducting layer, the second conducting layer and the electroluminescent layer is configured to be operable as a capacitive sensor.

Layer systems of this type in the form of electroluminescence sheets are available in many forms. A voltage is applied to the two conducting layers, and therefore a capacitive element is formed together with the electroluminescent layer. The film can be used as a sensor to sense a measurable change in the capacitance occurs caused by pressure or contact.

Electroluminescence sheets (light sheets) may be fit into a cutout in a flexible material. The material can be a plastics sheet, textile fabric or microfiber fleece. The flexible material can be used as a lining in a vehicle interior and can be used for operating various functional components of the vehicle, such as, a window opening mechanism, an air conditioning system or an airbag off switch. As a result, the operating element advantageously can be provided together with the lining.

The flexible material together with the operating element has a substantially flat extent. Thus, the material advantageously can be fit onto a surface in the vehicle interior without providing cutouts in the surface, as are necessary for the installation of conventional modules. The contact elements that connect the operating element to the corresponding functional components advantageously can be attached to any desired point of the flexible material, where they can be connected to the associated contact elements of the vehicle. The connection that leads from the operating element to the contacts likewise advantageously can be integrated into the flexible cloth.

The layer system integrated in the flexible material may be an electroluminescence sheet that is configured to be operated both as a pressure or contact sensor and as a light source. The conducting layers together with the enclosed electroluminescent layer form a capacitor. The measurable change in capacitance that takes place upon pressure or contact allows the capacitor to be operated as a sensor. Furthermore, however, the electroluminescent layer can also be excited into light emission by an electric continuous or alternating field applied between the conducting layers. The light emission also can be regulated via the strength of the applied field and can be used to transmit an optical signal that is visible to the user. It is thereby possible to connect the sensor action and the signal action in one element without two separate electric components being necessary for this purpose. Furthermore, the sensor function and the signal function of the element can be activated by the same connections. In addition, by means of the combination, it is advantageously possible for sensor action and signal action to be connected to the same surface and thus permit intuitive operation.

The invention also relates a method for operating an operating element. The operating element is integrated in a flexible material and comprises an electroluminescent layer arranged between a first conducting layer and a second conducting layer. The arrangement of the first conducting layer, the second conducting layer and the electroluminescent layer is configured to be operable as a capacitive sensor. In a first mode, the operating element may be operated as a capacitive sensor, wherein a pressure exerted on the operating element is detected by a change in capacitance. In a second mode, the operating element is operated as a light source.

In a first mode of the method, an electroluminescence sheet is activated in such a manner that a pressure or a contact of the sheet can be detected via a measurement of the capacitance. In a second mode, the sheet is activated in such a manner that light emission is excited in the electroluminescent layer. Since the layer system having the two conducting layers and the enclosed electroluminescent layer is operable both as a pressure or contact sensor and as illuminating means and the two functions can be activated by the same connections, such a method advantageously can be realized in a simple manner by the fact that suitably selected voltages are applied to the connection.

The optical signal action may be coupled to the detected contact. As a result, the brightness of the optical signal can be determined by the strength of the pressure exerted during the contact. If the control of the functional element operable via the contact is influenced by the strength of the exerted pressure, intuitive user operation is possible.

The optical signal action may be coupled to the duration of the detected contact. If the functional element connected to the operating element is regulated via the duration the contact, it is thus advantageously possible to vary the brightness with the duration of the contact and to provide the user with feedback about the state of regulation.

Further details, features and advantages of the invention emerge from the drawings and the description below of preferred embodiments with reference to the drawings. The drawings merely illustrate exemplary embodiments of the invention which do not restrict the inventive concept.

DETAILED DESCRIPTION

Figure 1:
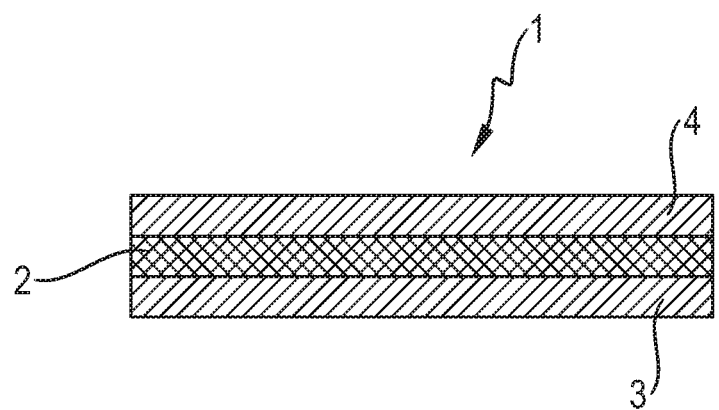
FIG. 1 schematically illustrates the arrangement according to the invention consisting of an electroluminescent layer and two conducting layers.

FIG. 1 schematically illustrates an arrangement 1 comprising first and second conducting layers 3 and 4 and an electroluminescent layer 2 surrounded by the two conducting layers 3, 4. Therefore, the arrangement 1 of the three layers is operable as a capacitor when an electric voltage is applied between the two conducting layers 3, 4. A contact or a pressure exerted on the layer arrangement 1 leads to a measurable change in capacitance, via which the contact or the pressure can be detected. If the electroluminescent layer 2 is excited to light emission by application of a continuous or alternating voltage between the conducting layers 3, 4, the arrangement 1 of the three layers can also be operated as a light source and can transmit optical signals to the user.

Figure 2:
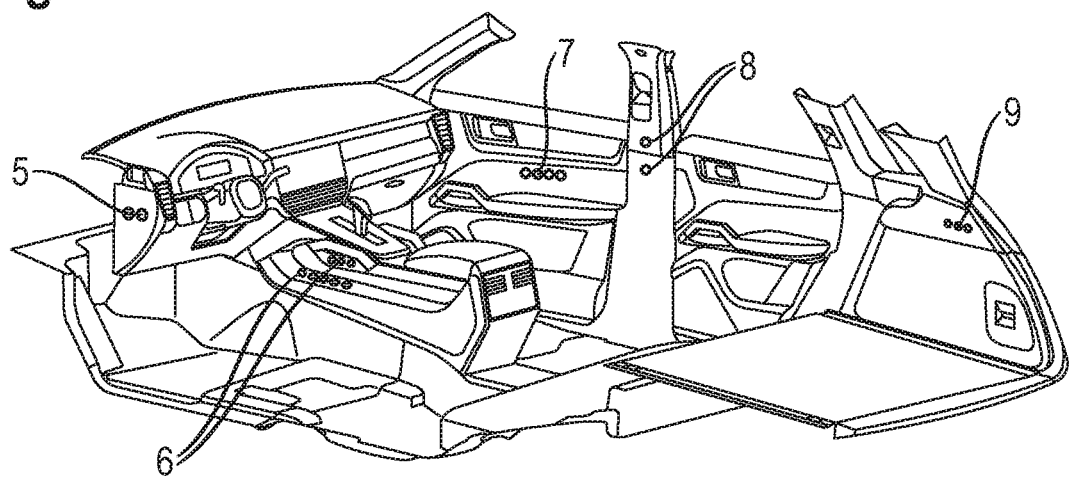
FIG. 2 schematically illustrates a plurality of possibilities of fitting the operating element according to the invention in the vehicle interior.

FIG. 2 illustrates possibilities of arranging the operating element of the invention in the vehicle interior. The operating element consists of a light sheet 1 that is fit into cutouts, for example in the form of perforations in a flexible material. The flexible material can then be used in diverse ways as a lining by being attached to a surface of the interior that is easily reachable by the user. The shape of this surface is subject only to a few restrictions since the flexible material can be adapted to the contours of the surface and can thus be clamped or adhesively bonded onto a multiplicity of surfaces. The actuation takes place via a contact of the sheet 1 or by pressure being exerted on the sheet 1. In the variant depicted here, operating elements are arranged directly next to one another. Thus, related functions or steps of a functional component, such as an air conditioning system, can be activated. For user-friendly positioning of the operating elements, it is crucial that they are easily reachable by the seated user and that the position of the operating elements is in an intuitively easily detectable relationship with the functional component that is to be operated. Furthermore, for operation by the driver, it is important that the operating elements are easily reachable by the driver from an upright sitting position and make it as easy as possible for the driver to keep his/her attention directed towards the traffic during the operating process.

For the driver, such an easily reachable first position 5 is provided, for example, at the sides of the front dashboard region. For example, an operating element for deactivating the airbag can be attached here. The center console has further positionings 6 on surfaces that are equally easily reachable by driver and passenger. For example, operating elements for the air conditioning and ventilation systems can be attached here. Control of the window opening mechanism customarily takes place via switches in the door side lining. Switches of this type can be replaced in a simple manner by an operating element that is attached at a position 7 of the inner door surface. Further easily reachable positions 8 are located on the B pillar in the center of the passenger cell. For operations which are carried out when the vehicle is stationary, positions 9 on various surfaces in the trunk are appropriate.

Figure 3:
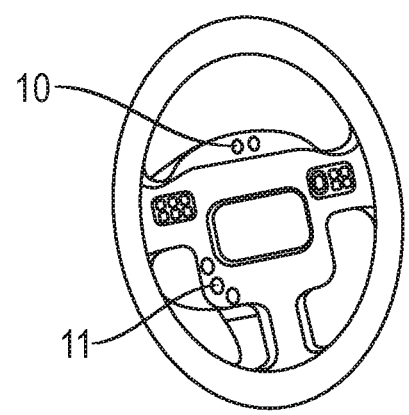
FIG. 3 schematically illustrates two possibilities of fitting the operating element according to the invention to the steering wheel.

FIG. 3 illustrates two different possibilities of attaching the operating element according to the invention to the steering wheel. As in FIG. 1, this involves a light sheet 1 that is fit into cutouts, for example perforations, in a flexible material. One possibility includes attaching one or more operating elements to the upper side 10 of the steering wheel. Further possible positions 11 are located on the lower sides of the steering wheel. Both positions 10, 11 are easily reachable by the driver and can be actuated without the driver being excessively distracted for the operation.

LIST OF REFERENCE SIGNS

1 Layer arrangement
2 Electroluminescent layer
3 First conducting layer
4 Second conducting layer
5 First positioning of the operating element
6 Second positioning of the operating element
7 Third positioning of the operating element
8 Fourth positioning of the operating element
9 Fifth positioning of the operating element
10 Sixth positioning of the operating element
11 Seventh positioning of the operating element

What is claimed is:

1. A vehicle, comprising: a vehicle interior, a surface in the vehicle interior and having no cutouts, a functional component, and an operating element controlling operation of the functional component, the operating element being integrated in a flexible material and comprising an electroluminescent layer arranged between a first conducting layer and a second conducting layer, the first conducting layer being disposed on the surface in the vehicle interior, the arrangement of the first conducting layer, the second conducting layer and the electroluminescent layer being configured to be operable as a capacitive sensor that controls the operation of the functional component.

2. The vehicle of claim 1, wherein the arrangement of the first conducting layer, the second conducting layer and the electroluminescent layer is additionally configured to be operated as a light source.

3. A method for operating vehicle of claim 2, wherein, in a first mode, the operating element is operated as a capacitive sensor, wherein a pressure exerted on the operating element is detected by a change in capacitance, and, in a second mode, the operating element is operated as a light source.

4. The method of claim 3, wherein a strength of the pressure exerted on the operating element that is operated as a light source is indicated by brightness.

5. The method of claim 3, wherein a duration of the pressure exerted on the operating element that is operated as a light source is indicated by the brightness.

6. The vehicle of claim 1, wherein the operating element is fit into one or more cutouts in the flexible material includes one or more cutouts, at least part of the operating element being fit into the one or more cutouts.

7. The vehicle of claim 1, wherein the functional component is a window operating mechanism that operates a window of the vehicle.

8. The vehicle of claim 1, wherein the functional component is an air conditioning system of the vehicle.

9. The vehicle of claim 1, wherein the functional component is an airbag off switch.

10. The vehicle of claim 1, wherein the flexible material defines a lining exposed in the vehicle interior.

11. The vehicle of claim 1, wherein the vehicle interior includes a center console and the flexible material is on the center console.

12. The vehicle of claim 1, wherein the vehicle interior includes an inner door surface, the flexible material defining a lining on the inner door surface.

13. The vehicle of claim 1, further comprising a B pillar with a surface facing the vehicle interior, the flexible material being applied to the surface of the be pillar facing the vehicle interior.

14. The vehicle of claim 1, wherein the vehicle interior includes a steering wheel, the flexible material being applied to a surface of the steering wheel.

15. The vehicle of claim 1, further comprising a trunk with a trunk surface defining part of the vehicle interior, the flexible material being applied to the trunk surface.

16. The vehicle of claim 1 wherein the flexible material is bonded adhesively to the surface of the vehicle interior.

17. The vehicle of claim 1 wherein the flexible material is clamped to the surface of the vehicle interior.

* * * * *